United States Patent
Refai-Ahmed et al.

(10) Patent No.: US 10,043,730 B2
(45) Date of Patent: Aug. 7, 2018

(54) STACKED SILICON PACKAGE ASSEMBLY HAVING AN ENHANCED LID

(71) Applicant: Xilinx, Inc., San Jose, CA (US)

(72) Inventors: Gamal Refai-Ahmed, Santa Clara, CA (US); Tien-Yu Lee, San Jose, CA (US); Ferdinand F. Fernandez, San Jose, CA (US); Suresh Ramalingam, Fremont, CA (US); Ivor G. Barber, Los Gatos, CA (US); Inderjit Singh, Saratoga, CA (US); Nael Zohni, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/867,349

(22) Filed: Sep. 28, 2015

(65) Prior Publication Data

US 2017/0092619 A1     Mar. 30, 2017

(51) Int. Cl.
*H01L 23/10* (2006.01)
*H01L 23/367* (2006.01)
(Continued)

(52) U.S. Cl.
CPC ........ *H01L 23/373* (2013.01); *H01L 21/4882* (2013.01); *H01L 23/04* (2013.01); *H01L 23/16* (2013.01); *H01L 23/367* (2013.01); *H01L 23/473* (2013.01); *H01L 25/0655* (2013.01); *H01L 25/18* (2013.01); *H01L 25/50* (2013.01); *H01L 23/40* (2013.01); *H01L 23/4006* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01);
(Continued)

(58) Field of Classification Search
CPC ........ H01L 23/4006; H01L 2023/4043; H01L 2023/405; H01L 2023/4062; H01L 2023/4068; H01L 2023/4087; H01L 2225/1094
See application file for complete search history.

(56) References Cited

U.S. PATENT DOCUMENTS 6,011,304 A * 1/2000 Mertol ............... H01L 23/04
                                                    257/704
6,650,538 B1 * 11/2003 Chu .................. H01L 23/467
                                                    165/121
(Continued)

OTHER PUBLICATIONS

Shi, Bing et al., "Hybrid 3D-IC Cooling System Using Micro-Fluidic Cooling and Thermal TSV's," Proc. of the 2012 IEEE Computer Society Annual Symposium on VLSI, Aug. 19, 2012, pp. 33-38, IEEE, Piscataway, New Jersey, USA.

*Primary Examiner* — Raj R Gupta
(74) *Attorney, Agent, or Firm* — Keith Taboada

(57) ABSTRACT

A method and apparatus are provided which improve heat transfer between a lid and an IC die of an IC (chip) package. In one embodiment, a chip package is provided that includes a first IC die, a package substrate, a lid and a stiffener. The first IC die is coupled to the package substrate. The stiffener is coupled to the package substrate and circumscribes the first IC die. The lid has a first surface and a second surface. The second surface faces away from the first surface and towards the first IC die. The second surface of the lid is conductively coupled to the IC die, while the lid is mechanically decoupled from the stiffener.

19 Claims, 13 Drawing Sheets

(51) Int. Cl.
*H01L 25/065* (2006.01)
*H01L 23/373* (2006.01)
*H01L 25/00* (2006.01)
*H01L 23/16* (2006.01)
*H01L 25/18* (2006.01)
*H01L 23/04* (2006.01)
*H01L 23/473* (2006.01)
*H01L 21/48* (2006.01)
*H01L 23/00* (2006.01)
*H01L 23/40* (2006.01)

(52) U.S. Cl.
CPC ............... *H01L 2224/16227* (2013.01); *H01L 2224/32225* (2013.01); *H01L 2224/32245* (2013.01); *H01L 2224/73203* (2013.01); *H01L 2224/73253* (2013.01); *H01L 2224/81815* (2013.01); *H01L 2224/83385* (2013.01); *H01L 2224/92125* (2013.01); *H01L 2924/14* (2013.01); *H01L 2924/1431* (2013.01); *H01L 2924/1434* (2013.01); *H01L 2924/15192* (2013.01); *H01L 2924/15311* (2013.01); *H01L 2924/3511* (2013.01); *H01L 2924/35121* (2013.01)

(56) References Cited

U.S. PATENT DOCUMENTS

| | | | | |
|---|---|---|---|---|
| 7,449,775 | B1* | 11/2008 | Ankireddi | H01L 23/4006 257/712 |
| 2004/0076408 | A1* | 4/2004 | Kenny | H01L 23/4275 392/340 |
| 2004/0099944 | A1* | 5/2004 | Kimura | H01L 23/4334 257/706 |
| 2006/0060637 | A1* | 3/2006 | Susheel | B23K 1/0016 228/207 |
| 2009/0039499 | A1* | 2/2009 | Chainer | H01L 23/3677 257/706 |
| 2010/0177477 | A1* | 7/2010 | Cheng | G06F 1/20 361/679.47 |
| 2014/0151871 | A1 | 6/2014 | Refai-Ahmed | |
| 2016/0019937 | A1 | 1/2016 | Arora et al. | |

\* cited by examiner

US 10,043,730 B2

STACKED SILICON PACKAGE ASSEMBLY HAVING AN ENHANCED LID

TECHNICAL FIELD

Embodiments of the present disclosure generally relate to a chip package, and in particular, to chip package comprising at least one integrated circuit (IC) die covered by a lid, the lid having features for enhanced temperature control of the package assembly.

RELATED ART

Electronic devices, such as tablets, computers, copiers, digital cameras, smart phones, control systems and automated teller machines, among others, often employ electronic components which leverage chip packages for increased functionality and higher component density. Conventional chip packaging schemes often utilize package substrates, often in conjunction with a through-silicon-via (TSV) interposer, to enable a plurality of integrated circuit (IC) dies to be mounted to a single substrate. The IC dies may include memory, logic or other IC device.

In many instances, a lid is utilized to substantially cover one or more of the dies. The lid is part of the packaging of the IC structure. The lid can be formed of a plastic, metal or other suitable material, and is mounted to the die and interposer or package substrate using an adhesive, such as a heat transfer paste or other suitable bonding material. The lid functions to protect the die from damage, such as from impact from another object or from ultraviolet light which might damage the die.

As lid is often secured over the die using an adhesive, the rigid connection between the lid and die often leads to poor temperature control. For example, in packages having two or more dies, tolerance issues and differences in die heights often cause one die to transfer heat to the lid at a much different rate relative to another die in the package. This difference in heat transfer may cause one die to operate much differently than other. Moreover, the rigid connection between the lid and chip package may also undesirably increase the amount of stress induced on the chip package.

Therefore, a need exists for an improved chip package, and in particular, a chip package having a lid that includes improved features for temperature control.

SUMMARY

A method and apparatus are provided which improve heat transfer between a lid and an IC die of an IC (chip) package. In one embodiment, a chip package is provided that includes a first IC die, a package substrate, a lid and a stiffener. The first IC die is coupled to the package substrate. The stiffener is coupled to the package substrate and circumscribes the first IC die. The lid has a first surface and a second surface. The second surface faces away from the first surface and towards the first IC die. The second surface of the lid is conductively coupled to the IC die, while the lid is mechanically decoupled from the stiffener.

In another embodiment, a lid for a chip package is provided. The lid includes a top housing sealingly coupled to a bottom housing, and a cavity defined between the top and bottom housings. The cavity includes a center zone connecting an inlet zone and an outlet zone. The inlet zone has a volume expanding in a direction away from an inlet port. The outlet zone has a volume decreasing in a direction towards an outlet port. The cavity additionally includes a plurality of heat transfer fins extending into the center zone.

In another embodiment, a method for forming a chip package is provided. The method sequentially includes printing surface mounting paste on a substrate; mounting surface components to the surface mounting paste; performing a first reflow process to reflow solder in the surface mounting paste and electrically connect the surface components to the substrate; forming package bumps on a coined surface of the substrate; attaching a stiffener to the substrate; mounting IC dies to the substrate; performing a second reflow process to reflow solder in the package bumps to electrically connect the IC dies to the substrate; dispensing an underfill in contact with the substrate; attaching solder balls attached to a side of the substrate opposite the IC dies; and performing a third reflow process to reflow solder in the solder balls to electrically connect the substrate to a printed circuit board (PCB).

In yet another embodiment, a method for forming a chip package is provided. The method sequentially includes printing surface mounting paste on a substrate; mounting surface components to the surface mounting paste; performing a first reflow process to reflow solder in the surface mounting paste and electrically connect the surface components to the substrate; forming package bumps on a coined surface of the substrate; mounting IC dies to the substrate; performing a second reflow process to reflow solder in the package bumps to electrically connect the IC dies to the substrate; dispensing an underfill in contact with the substrate; attaching a stiffener to the substrate; attaching solder balls attached to a side of the substrate opposite the IC dies; and performing a third reflow process to reflow solder in the solder balls to electrically connect the substrate to a printed circuit board (PCB).

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Embodiments of the disclosure generally provide a chip package having one or more integrated circuit (IC) dies covered by a lid. The lid includes features that enhance control of heat transfer between the IC dies and the lid. Advantageously, the enhanced heat transfer control between the IC die and the lid reduces delaminating and warping of the chip package due to stress. Additionally, some implementations are configured to the tailor heat transfer between the IC dies in a chip package. For example, the lid may include features that compensate for height or tolerance differences between the IC die which could otherwise result in non-uniform heat transfer and/or cause a difference in performance between dies. In another example, the lid may include features that compensate for thermal budget differences between IC dies which could otherwise result in damage to and/or performance loss in one or more of the IC dies. Thus, the enhanced heat transfer control between the IC die and lid promotes better device performance over a wider range of operating conditions, with less expense and manufacturing complexity, while additionally providing more uniform chip package to chip package performance.

Figure 1:
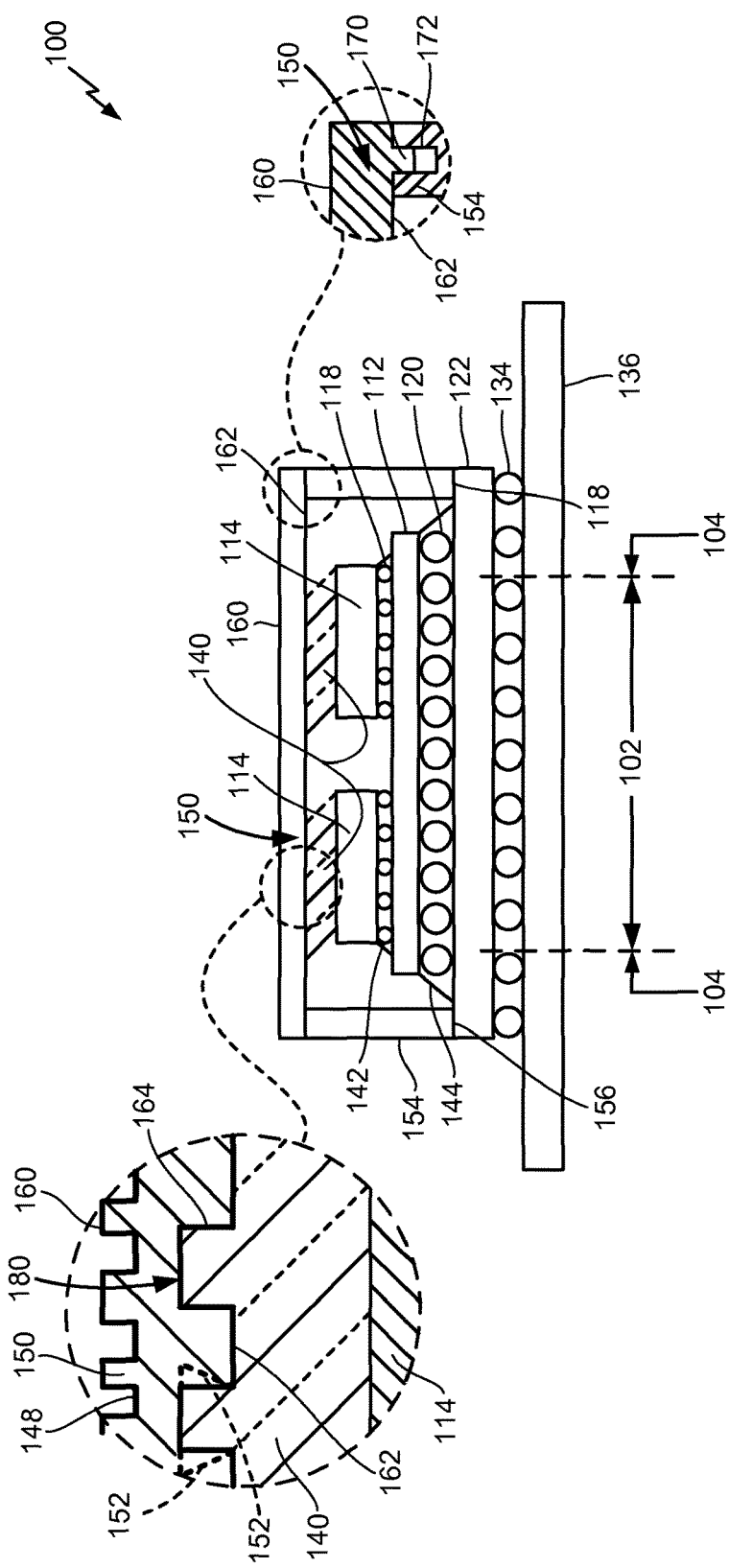
FIG. 1 is a cross sectional schematic view of an integrated chip package including one or more IC dies covered by a lid.

Turning now to FIG. 1, an exemplary integrated chip package 100 is schematically illustrated. The chip package 100 includes at least one or more IC dies 114 connected optionally by a silicon-through-via (TSV) interposer 112 to a package substrate 122. Although two IC dies 114 are shown in FIG. 1, the number of IC dies may range from one to as many as can be fit within the chip package 100.

The interposer 112 includes circuitry for electrically connecting the IC dies 114 to circuitry of the package substrate 122. The circuitry of the interposer 112 may optionally include transistors. Package bumps 120, also known as "C4 bumps," are utilized to provide an electrical connection between the circuitry of the interposer 112 and the circuitry of the package substrate 122. The package substrate 122 may be mounted and connected to a printed circuit board (PCB) 136, utilizing solder balls 134, wire bonding or other suitable technique. An undermolding 144 may be utilized to fill the space not taken by the package bumps 120 between the PCB 136 and the interposer 112, thereby providing structural rigidity to the chip package 100.

The IC dies 114 are mounted to one or more surfaces of the interposer 112, or alternatively in embodiments wherein an interposer is not utilized, to the package substrate 122. The IC dies 114 may be programmable logic devices, such as field programmable gate arrays (FPGA), memory devices, optical devices, processors or other IC logic structures. Optical devices include photo-detectors, lasers, optical sources, and the like. In the embodiment depicted in FIG. 1, the IC dies 114 are mounted to a top surface of the interposer 112 by a plurality of micro-bumps 118. The micro-bumps 118 electrically connect the circuitry of each IC die 114 to circuitry of the interposer 112. The circuitry of the interposer 112 connects the micro-bumps 118 to selective package bumps 120, and hence, connects selective circuitry of each IC die 114 to the package substrate 122, to enable communication of the IC dies 114 with the PCB 136 after the chip package 100 is mounted within an electronic device (not shown). When the optional interposer 112 is not present, the micro-bumps 118 connects selective circuitry of each IC die 114 to the package substrate 122 to enable communication of the IC dies 114 with the PCB 136. An undermolding 142 may be utilized to fill the space not taken by the micro-bumps 118 between the IC dies 114 and interposer 112 to provide structural rigidity to the chip package 100.

The chip package 100 additionally includes a stiffener 154. The stiffener 154 is coupled to the package substrate 122 and circumscribes the IC dies 114. The stiffener 154 can extend to peripheral edges of the package substrate 122 to provide mechanical support which helps prevent the chip package 100 from bowing and warpage. The stiffener 154 may be a single layer structure or a multi-layer structure. The stiffener 154 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. The stiffener 154 can also be made of organic materials such as copper-clad laminate.

A lid 150 is disposed over the IC dies 114. In some embodiments, the lid 150 may be fabricated from a plastic material or other suitable material. In other embodiments particularly where it is desirable to utilize the lid 150 to receive heat from the IC dies 114, the lid 150 may be fabricated from a thermally conductive material, such as copper, nickel-plated copper or aluminum, among other suitable materials. The lid 150 may have a thickness of between about 0.5 mm and about 3.0 mm, although other thicknesses may be utilized.

The lid 150 has a top surface 160 and a bottom surface 162. The top surface 160 forms the exterior top surface of the chip package 100, while the bottom surface 162 faces the IC dies 114. A heat sink, not shown, may optionally be mounted to the top surface 160 of the lid 150.

Generally, the lid 150 is at least disposed over the IC dies 114. A thermal interface material (TIM) 140 may be utilized to thermally and/or mechanically couple the lid 150 to the IC dies 114. The TIM 140 may be selected to provide a thermally conductive path between the lid 150 to the IC dies 114 so that heat generated by the IC dies 114 may be dissipated through the lid 150.

The TIM 140 is generally a heat transfer material having a conductivity of at least about 0.3 W/m·K. Examples of materials suitable for use the TIM 140 includes thermal grease, thermally conductive epoxy, phase change materials, conductive tapes, and silicone-coated fabrics among other suitable materials. The TIM 140 may be a soft or compliant adhesive to allow compensation between mismatched heights of neighboring IC dies 114 within the chip package 100. In one example, the TIM 140 may be a thermal gel or thermal epoxy, such as for example, packaging component attach adhesives available from AI Technology, Inc., located in Princeton Junction, N.J. In another example, the TIM 140 may be a applying phase change material, such as Laird PCM 780.

The lid 150 may also be disposed over the stiffener 154. In some implementations, the lid 150 may be bonded to the stiffener 154 by an adhesive (not shown), such as an epoxy.

In other implementations, the lid 150 located relative to the stiffener 154 by a pin 170. The pin 170 may be attached to only one of the lid 150 and the stiffener 154, so that the lid 150 and stiffener are mechanically decoupled. The mechanical decoupling allows the lid 150 to move freely (i.e., "float") relative to the stiffener 154. In this manner, stresses between the lid 150 and the stiffener 154 are mechanically decoupled, resulting in less warpage and delamination of the various layers and components of the chip package 100.

In the embodiment depicted in FIG. 1, the pin 170 is attached to the lid 150. For example, the pin 170 may be bonded, screwed in, force fit or otherwise attached to the lid 150. The pin 170 extends from the bottom surface 162 of the lid 150 into a clearance hole 172 formed in a top of the stiffener 154 to allow the lid 150 to move relative to the stiffener 154. In some implementations, the pin 170 is an integral part of the lid 150. For example, the pin 170 may be formed by stamping the lid 150 to project the pin 170 from the bottom surface 162 of the lid 150. In another example, the pin 170 may be a projection formed during 3D printing of the lid 150.

One advantage of having the lid 150 separate from the stiffener 154 is that the package assembler or even the end user may add the lid 150. This allows the chip package fabricator to make and stock a single component, to which the package assembler, other fabricator or user may add the lid 150 at a later fabrication stage or even during use.

The bottom surface 162 of the lid 150 may optionally include engineered features 180 which improve the interface between the lid 150 and the TIM 140. In one example, the engineered features 180 may enhance the adhesion between the lid 150 and the TIM 140. Increased adhesion between the lid 150 and the TIM 140 helps maintain the lid 150 firmly attached to the chip packaging 100. Alternatively or in addition increasing the adhesion between the lid 150 and the TIM 140, the engineered features 180 may enhance the rate of heat transfer between the lid 150 and the TIM 140. Increased heat transfer between the lid 150 and TIM 140 helps maintain the temperature of the IC die 114, which in turn improves device performance and helps maintain performance uniformity between different chip packages.

The engineered feature 180 is generally a predefined structure formed in or on the bottom surface 162 of the lid 150. For example, a predefined structure may be formed with a predefined geometry, such as cross-sectional area, height (or depth), width and pitch between structure. The engineered features 180 may be formed in a predefined pattern, for example, a pattern of structures that are spaced at regular and repeating intervals.

As only a region 102 of the lid 150 above the IC dies 114 needs to be in contact with the TIM 140, the engineered features 180 may be only disposed in the region 102 above the IC dies 114. Thus, a region 104 of the lid 150, typically disposed outward of the IC dies 114, may be free of engineered features 180, thereby reducing manufacturing costs. Alternatively, the engineered features 180 may extend completely or almost completely across the bottom surface 162 of the lid 150.

The engineered features 180 function to increase the surface area of the lid 150 that is in contact with the TIM 140. The increased surface area improves the adhesion between the lid 150 and the TIM 140, thus reducing the potential of the lid 150 delaminating from the chip package 100. Moreover, the increased surface area improves heat transfer between the lid 150 and the TIM 140, thus improving the performance of the IC die 114.

In one embodiment, such as shown in the enlarged portion of FIG. 1, the engineered features 180 are in the form of recesses 164 formed in the bottom surface 162 of the lid 150. The each recess 164 may be a blind hole, dimple, groove or have another suitable geometric form. The recesses 164 may have a circular, rectangular, hexagonal or other cross sectional profile. In the embodiment illustrated in FIG. 1, the sidewalls of the recesses 164 are shown as being perpendicular to the bottom surface 162 of the lid 150. The recesses 164 may be in the form of intersecting grooves, a grid, spiral, close packed array or other arrangement. Alternatively, the sidewalls of the recesses 164 may be disposed at an angle less than or greater than 90 degrees relative to the bottom surface 162 of the lid 150. For example, sidewalls (152 shown in phantom) of the recess 164 may be tapered inward at the bottom of the recess 164 such that the bottom of the recess 164 is wider than the opening of the recess 164 at the bottom surface 162 of the lid 150. In another example, the sidewalls of the recess 164 may include an undercut or groove. The taper, undercut and/or groove in the sidewalls of the recess 164 improves the adhesion of the TIM 140 to the lid 150 by providing a mechanical interlock. The engineered features 180 may alternatively be projections.

The recesses 164 may be formed by machining, laser machining, pattern transfer or additive manufacturing process (such as 3-D printing), among others. Pattern transfer manufacturing techniques may utilize a mask to define openings that exposed predefined portions of the bottom surface 162 of the lid 150, which may then be selectively removed by etching, bead blasting, grit blasting and the like, to form the recesses 164. Additive manufacturing processes sequentially stack material to form the lid 150, leaving gaps in the stacked material that form the recesses 164 in the bottom surface 162 of the lid 150 once the additive process is complete.

When used with TIM 140 in the form of a phase change material, the TIM 140 will flow between and around the engineered features 180. This feature will allow the TIM 140 at its phase change temperature, in an example of Laird 780Sp at about 70 degrees Celsius, to be softened and fill all potential gaps between engineered features 180 and the IC die 114, as well as, to form very thin TIM layer between the tip of the engineered features 180 and the IC die 114, which will very effectively spread the heat from the localized hots spot on the die 114.

Similarly, the top surface 160 of the lid 150 may optionally include engineered features 180 that improve the interface between the lid 150 and a thermal interface material (not shown) disposed between the lid 150 and a heat sink (also not shown in FIG. 1). In one example, the engineered features 180 may enhance the rate of heat transfer between the lid 150 and the heat sink disposed on the lid 150. Increased heat transfer between the lid 150 and heat sink helps maintain the temperature of the IC die 114, which in turn improves device performance and helps maintain performance uniformity between different chip packages. Additional embodiments that include thermal interface material and a heat sink are further discussed below.

In one embodiment, such as shown in the enlarged portion of FIG. 1, the engineered features 180 are in the form of recesses 148 formed in the top surface 160 of the lid 150. The recesses 148 may be formed similar to the recesses 164 formed in the bottom surface 162 of the lid 150.

Figure 1A:
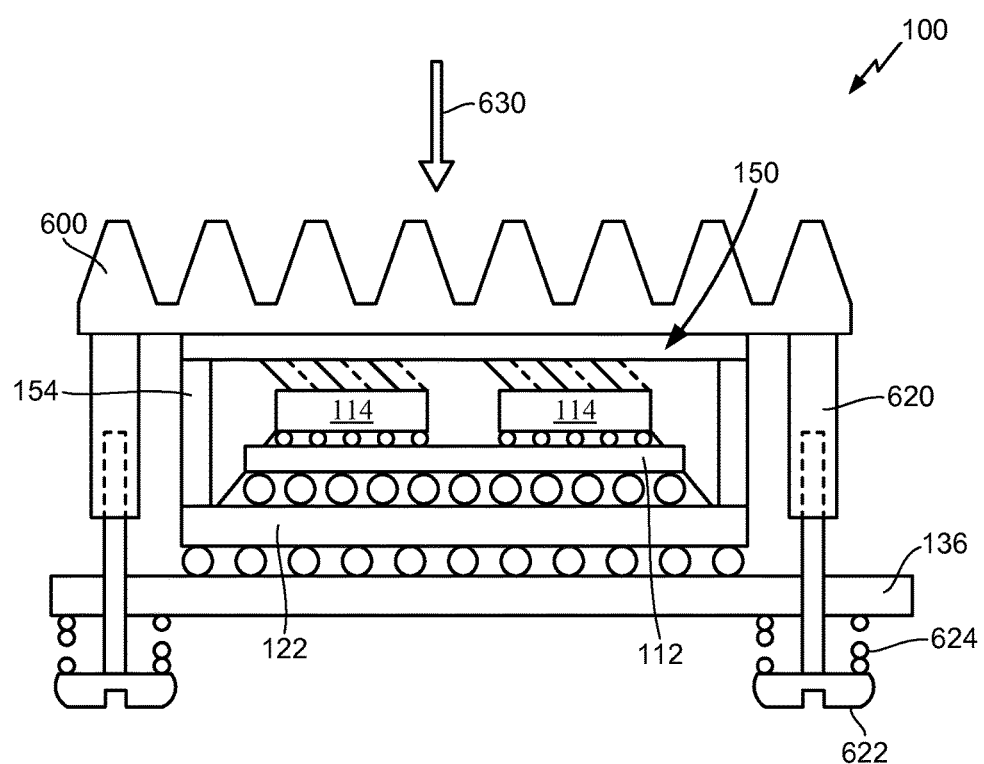
FIG. 1A is a side view of the integrated chip package of FIG. 1 with a heat sink mounted to a printed circuit board.

FIG. 1A is a side view of the integrated chip package 100 of FIG. 1 with a heat sink 600 mounted to a printed circuit board 136. The heat sink 600 is coupled to the printed circuit board 136 in a manner that captures the lid 150 to the stiffener 154. In some implementations, a fastener 622 may be threadingly engaged with the heat sink 600 so that the heat sink 600 exerts a force on the lid 150 in a direction of the dies 114, as illustrated by arrow 630. Optionally, a spring 624 or other resilient object may be disposed between the fastener 622 and the printed circuit board 136 to provide force that the heat sink 600 exerts on the lid 150. Advantageously, the force provided by the heat sink 600 allows the lid 150 to maintain good thermal contact with the dies 114, while remaining floating on the stiffener 154.

Figure 2:
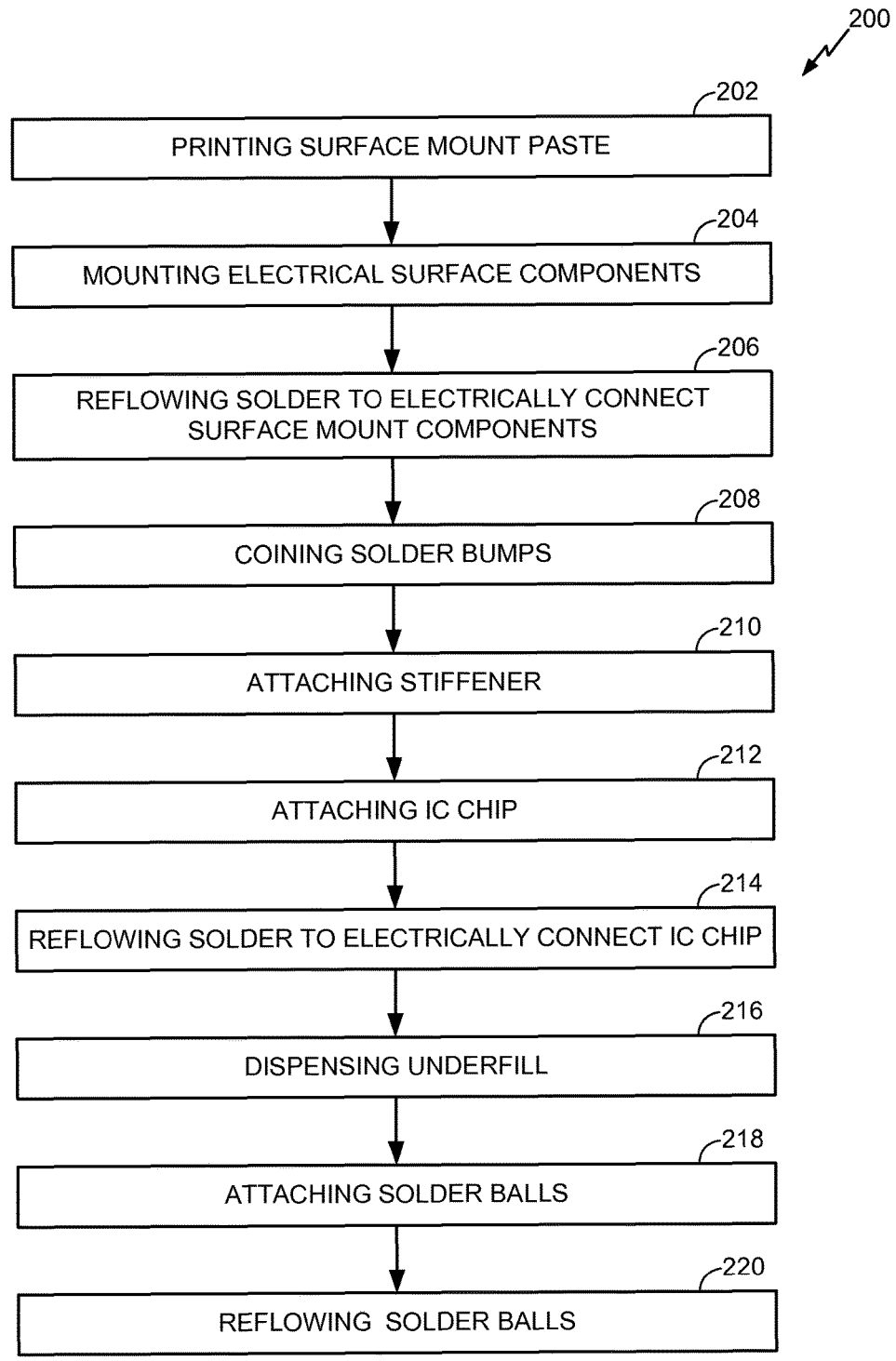
FIGS. 2-3 are flow diagrams of various methods for fabricating an integrated chip package having a lid.
Figure 3:
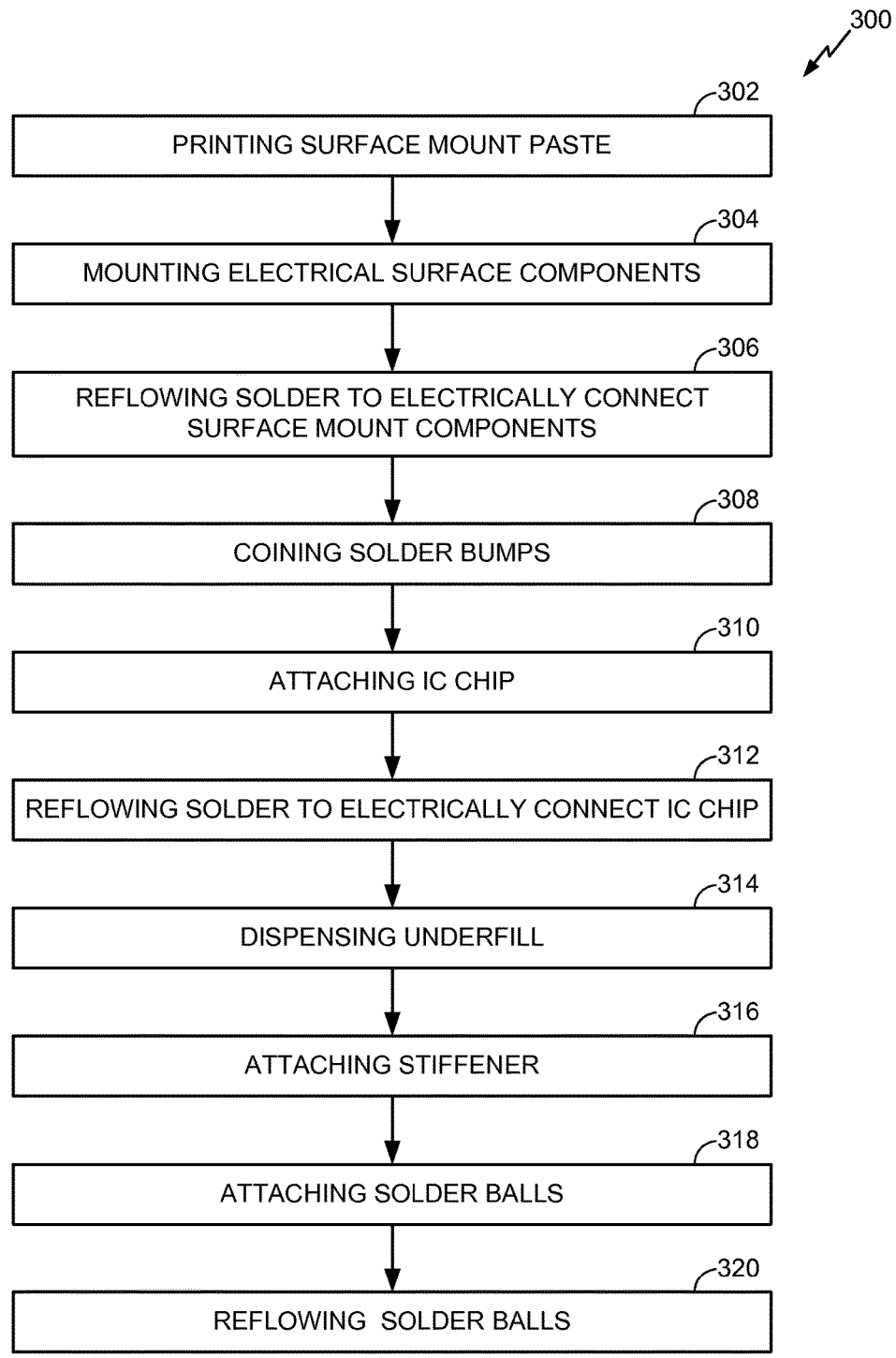

FIGS. 2-3 are flow diagrams of various methods for fabricating an integrated chip package 100 having a lid 150. Referring first to FIG. 2, a method 200 for fabricating an integrated chip package 100 having a lid 150 is provided. The method 200 begins at block 202 by printing surface mounting paste on a substrate, such as the package substrate 122, at pad locations where surface components are to be placed. The surface mounting paste may be printed using screen printing, ink jet printing or other suitable process.

At block 204, surface components, such as diodes, capacitors, resistors and the like, are mounted to the surface mounting paste. At block 206, a first reflow process is performed to reflow solder to electrically connect the component leads of the surface components to the pads on the package substrate 122. The first reflow process may be performed in a conveyor oven or using other suitable technique. At block 208, solder bumps formed on the package substrate 122 are coined. Package bumps 120 are then formed on the coined surface.

At block 210, the stiffener 154 is attached to the package substrate 122. As discussed above, the stiffener 154 may be attached to the package substrate 122 using an epoxy or other suitable adhesive.

At block 212, IC chips, such as the IC dies 114, are attached to the package substrate 122. The IC dies 114 may be directly attached to the package substrate 122, or an interposer 112 already having the IC dies 114 mounted thereon may be attached to the package substrate 122. At block 214, a second reflow process is performed to reflow solder in the package bumps 120 to electrically connect the IC dies 114 to the package substrate 122. The second reflow process may be performed in a conveyor oven or using other suitable technique.

At block 216, underfill, such as the undermolding 144, is dispensed between the package substrate 122 and interposer 112. If the IC dies 114 are directly mounted to the package substrate 122, the underfill may be directly disposed between the IC dies 114 and the package substrate 122.

At block 218, solder balls 134 are attached to a side of the package substrate 122 opposite the IC dies 114. At block 220, a third reflow process is performed to reflow solder in the solder balls 134 to electrically connect the package substrate 122 to the PCB 136. The third reflow process may be performed in a conveyor oven or using other suitable technique.

One advantage of the method 200 is that the stiffener attach at block 210 occurs prior to the chip attach at block 212, which happens in reverse order when practicing a conventional fabrication process. Attaching the stiffener prior to the chip reduces warpage that may be induced during the subsequent solder reflows. Thus, the method 200 produces flatter chip package 100, which additionally has a reduced amount of stress as compared to conventionally fabricated chip packages, and thus, helps prevent solder joint defects from occurring.

FIG. 3 depicts a flow diagram of another method 300 for fabricating an integrated chip package 100 having a lid 150. The method 300 begins at block 302 by printing surface mounting paste on a substrate, such as the package substrate 122, at pad locations where surface components are to be placed. The surface mounting paste may be printed using screen printing, ink jet printing or other suitable process.

At block 304, surface components are mounted to the surface mounting paste. At block 306, a first reflow process is performed to reflow solder to electrically connect the component leads of the surface components to the pads on the package substrate 122. The first reflow process may be performed in a conveyor oven or using other suitable technique. At block 308, solder bumps formed on the package substrate 122 are coined. Package bumps 120 are then formed on the coined surface.

At block 310, IC chips, such as the IC dies 114, are attached to the package substrate 122. The IC dies 114 may be directly attached to the package substrate 122, or an interposer 112 already having the IC dies 114 mounted thereon may be attached to the package substrate 122. At block 312, a second reflow process is performed to reflow solder in the package bumps 120 to electrically connect the IC dies 114 to the package substrate 122. The second reflow process may be performed in a conveyor oven or using other suitable technique.

At block 314, underfill, such as the undermolding 144, is dispensed between the package substrate 122 and interposer 112. If the IC dies 114 are directly mounted to the package substrate 122, the underfill may be directly disposed between the IC dies 114 and the package substrate 122.

At block 316, the stiffener 154 is attached to the package substrate 122. As discussed above, the stiffener 154 may be attached to the package substrate 122 using an epoxy or other suitable adhesive.

At block 318, solder balls 134 are attached to a side of the package substrate 122 opposite the IC dies 114. At block 320, a third reflow process is performed to reflow solder in the solder balls 134 to electrically connect the package substrate 122 to the PCB 136. The third reflow process may be performed in a conveyor oven or using other suitable technique.

One advantage of the method 300 is that the chip is attached prior to the stiffener. Attaching the stiffener after the chip provides more clearance for the underfill dispense needle to operate, and thus allows the underfill to be dispensed more easily. Thus, the method 300 provides a more efficient assembly flow for fabricating the chip package 100.

Figure 4:
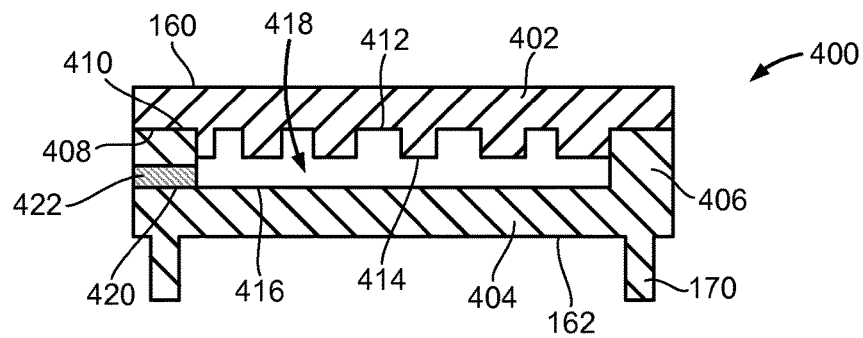
FIG. 4 is a sectional view of an alternative embodiment of a lid which may be utilized in the integrated chip package of FIG. 1.

FIG. 4 is a sectional view of an alternative embodiment of a lid 400 which may be utilized in the integrated chip package 100 of FIG. 1. The lid 400 includes pins 170 which are utilized for mounting the lid 400 to the stiffener 154 as discussed above with reference to FIG. 1. The lid 400 additionally includes an internal cavity 418 which may be charged with a captured heat transfer material with provides passive heat transfer. The heat transfer material, such as a fluid, gas, gel or multi-phase heat transfer material, may be disposed in the internal cavity 418 to enhance the heat transfer characteristics of the lid 400. The heat transfer material, such as a fluid, disposed in the internal cavity 418 may be selective to provide a passive 2-phase circulating heat transfer flow within the internal cavity 418 when the chip package 100 is operating. For example, the heat transfer material may boil at a high pressure and condense back to a liquid as the heat transfer material circulates within the cavity 418, thereby greatly increasing the heat transfer rate between the top and bottom surfaces 160, 162 of the lid 400, thereby allowing better temperature control within the chip package 100.

The lid 400 includes a top plate 402 and a bottom plate 404. The top plate 402 includes an interior surface 412 that faces away from an exterior surface of the top plate 402 that defines the top surface 160 of the lid 400. The bottom plate 404 includes an interior surface 416 that faces away from an exterior surface of the bottom plate 404 that defines the bottom surface 162 of the lid 400. As discussed above, the exterior top and bottom surfaces 160, 162 of the lid 400 may optionally include engineered features, such as the engineered features 180, to improve heat transfer from the IC die 114.

The plates 402, 404 are coupled together to define the cavity 418 therebetween. In one implementation, the plates 402, 404 may be coupled by brazing, soldering, adhesive, welding or other technique that produces a substantially leak-free joint between the plates 402, 404.

A sidewall 406 spaces of the plates 402, 404 from the other to form the cavity 418 therebetween. The sidewall 406 may be a separate component of the lid 400, or be part of one of the plates 402, 404. In the embodiment depicted in FIG. 4, the sidewall 406 is part of the bottom plate 404 and projects from the interior surface 416 to a distal end 408, which is sealingly coupled to a mounting surface 410 of the top plate 402.

A passage 420 is formed through one of the plates 402, 404 or sidewall 406 and fluidly couples to the cavity 418. The passage 420 allows the heat transfer material to be introduced into the cavity 418. The passage 420 may be sealed using a plug 422 to prevent the heat transfer material from leaking from the cavity 418 through the passage 420. Once sealed, the cavity 418 becomes a vapor chamber that combines the principles of both thermal conductivity and phase transition to efficiently manage the transfer of heat between two solid interfaces, that is the plates 402, 404 bounding opposite sides of the cavity 418. At the hot interface of the cavity 418, i.e., the bottom plate 404 facing the IC die 114, the heat transfer material in a liquid phase in contact with a thermally conductive solid surface turns into a vapor by absorbing heat from the bottom plate 404. The vapor then travels between the hot bottom plate side of the cavity 418 to the cold interface, i.e., the top plate 402, and condenses back into a liquid—releasing the latent heat. The liquid then returns to the hot interface through either capillary action and/or gravity, and the cycle repeats. Due to the very high heat transfer coefficients for boiling and condensation, the lid 400 functions as a heat pipe to highly effectively and efficiently conduct heat between the top and bottom plates 402, 404. Conventional lids of the current state of the art generally utilize solder to couple the lid to the heat spreader, and thus cannot withstand the high temperature differentials enabled by use of the floating lid 400 without warping, fluid loss or other damage. Thus, the floating lid 400 configured as vapor chamber provides a significant improvement over the state of the art by enabling significantly greater heat transfer as compared to conventional designs.

At least one or both of the interior surfaces 412, 416 of the lid 400 bounding the cavity 418 may include one or more heat transfer enhancing surface features 414. Although the heat transfer enhancing surface features 414 are shown in FIG. 4 extending from the interior surface 412 of the top plate 402 into the cavity 418, the heat transfer enhancing surface features 414 may additionally or alternatively extend from the interior surface 416 of the bottom plate 404 into the cavity 418. The heat transfer enhancing surface features 414 may be engineered features, such as the engineered features 180 described above, or other surface texture. The surface features 414 may alternatively be a knurled pattern, a bead blasted surface or other roughened surface texture.

Advantageously, the lid 400 enables a heat transfer material to be efficiently trapped within the lid 400, which greatly enhances heat transfer from the IC dies 114. The extra surface area provided by the surface features 414 further contribute to increasing the heat transfer rate from the dies 114 to the lid 400, thereby improving device performance.

Figure 5:
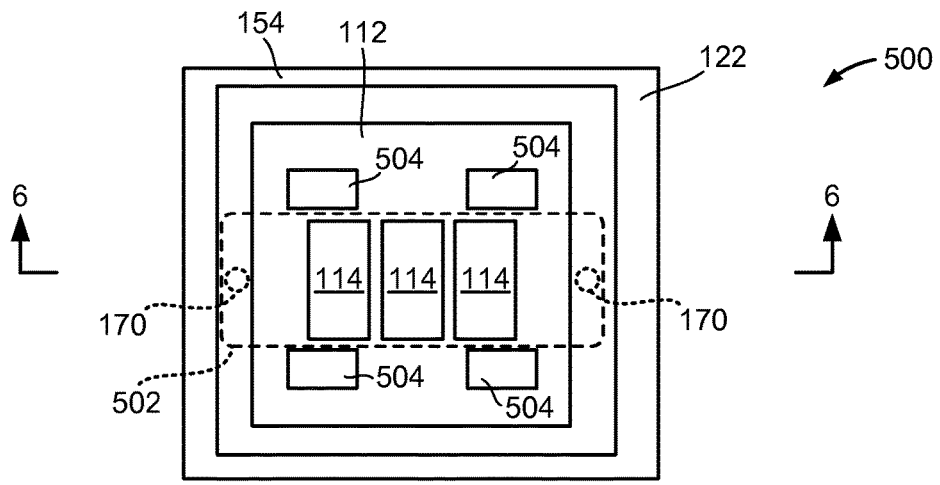
FIG. 5 is a top view of an integrated chip package having a lid that only covers some of the dies of an integrated chip package.

FIG. 5 is a top view of an integrated chip package 500 having a lid 502 (shown in phantom) that only covers some of the dies of the integrated chip package 500. For example, a plurality of IC dies may be disposed on the package substrate 122, of which the IC dies can be grouped into a first set of IC dies 114 and a second set of IC dies 504. The first set of IC dies 114 share some physical characteristic that is different than that of the second set of IC dies 504. For example, the physical characteristic may be one of physical strength or thermal budget. In the embodiment depicted in FIG. 5, the first set of IC dies 114 have a different thermal budget, for example higher, than that of the second set of IC dies 504. Thus, the lid 502 may be utilized to contact only one of the sets of IC dies 114, 504 so that heat transfer from the IC dies 114, 504 is conducted from the IC dies 114, 504 at different rates, thereby allowing denser die spacing with reduces thermal cross-talk between dies.

Figure 6:
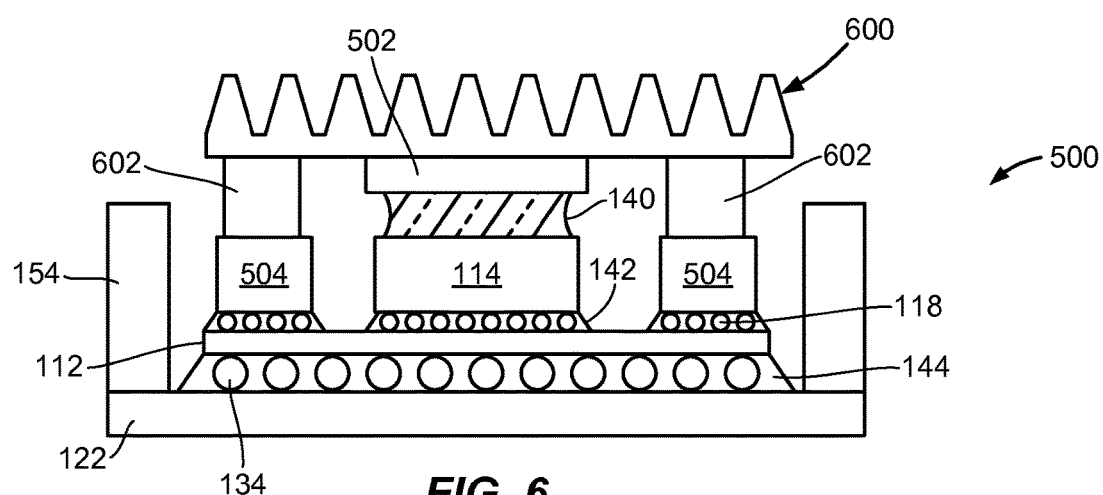
FIG. 6 is a sectional view of the integrated chip package taken along section line 6-6 of FIG. 5.

FIG. 6 is a sectional view of the integrated chip package 500 taken along section line 6-6 of FIG. 5. As shown in FIG. 6, the first set of IC dies 114 are in contact with the lid 502 through a TIM 140, such as a thermal grease or other thermal interface material. The lid 502 is in contact with a heat sink 600. Although not shown, a thermal interface material may be disposed between the lid 502 and the heat sink 600 to enhance heat transfer therebetween.

Since the second set of IC dies 504 have a lower thermal budget than the first set of IC dies 114, the second set of IC dies 504 may be thermally isolated from the lid 502. The second set of IC dies 504 may also be thermally isolated from the heat sink 600. For example, a thermal barrier 602, such as a material that is a poor thermal conductor, may be disposed between the second set of IC dies 504 and the heat sink 600. In one embodiment, the thermal barrier 602 is a dielectric foam material.

Thus, the arrangement of the lid 502 and IC dies 114, 504 allow the heat transfer from the IC dies 114, 504 to be separately tailored. Separate control of the heat transfer rates regulating the temperature of the IC dies 114, 504 is particularly beneficial when the first set of IC dies 114 are logic devices such as processors, and the second set of IC dies 504 are memory devices. Additionally or alternatively, the arrangement of the lid 502 and IC dies 114, 504 allow the loading force between the IC dies 114, 504 to be separately tailored. Separate control of the loading force applied to each of the IC dies 114, 504 is particularly beneficial when the first set of IC dies 114 are high strength dies, for example logic devices such as processors, and the second set of IC dies 504 are low strength dies, for example memory devices because the logic devices generally can withstand much higher loads relative to memory devices without becoming damaged. The higher loads generally also allow for improved heat transfer rates.

Figure 7:
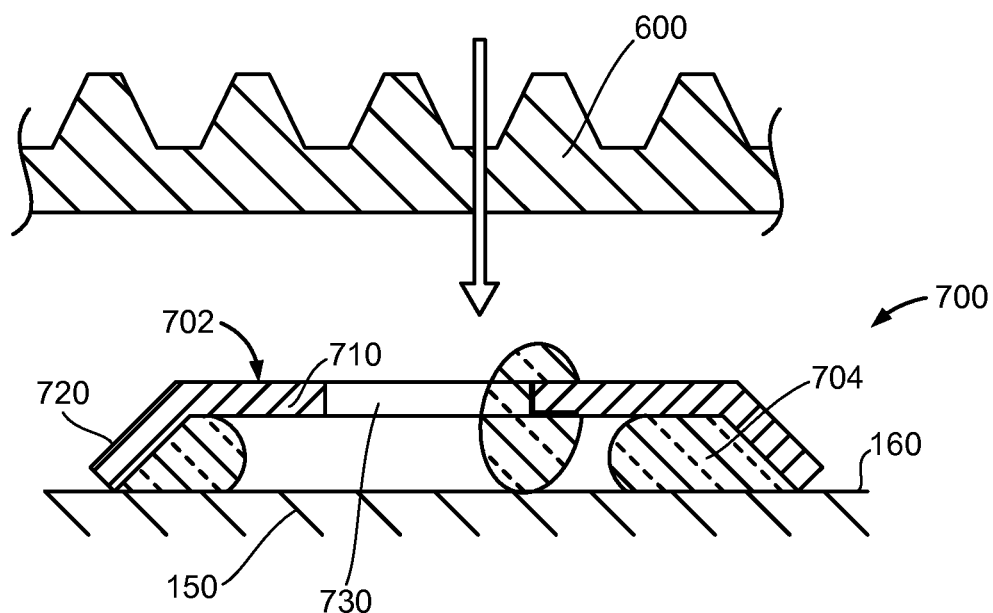
FIG. 7 is partially exploded, partial sectional view of a lid of an integrated chip package having an external spring form for enhancing heat transfer.

FIG. 7 is partially exploded, partial sectional view of a lid 150 of an integrated chip package 700 having an external spring form 702 for enhancing heat transfer between the chip package 700 and a heat sink 600. The lid 150 may be utilized with the chip packages 100, 500 depicted in FIGS. 1 and 5, or other suitable chip package.

The spring form 702 includes a first contact surface 710 and a second contact surfaced 720. The spring form 702 is configured such that the first contact surfaces 710 remains in contact with the top surface 160 of the lid 150, while the second contact surfaces 720 remains in contact with the bottom surface of the heat sink 600 when the heat sink 600 is mounted to the chip package, thereby compressing the spring form 702. Although the first contact surface 710 is shown outward of the second contact surfaced 720, the relative arrangement between the contact surfaces 710, 720 may be chosen as desired.

The spring form 702 may include one or more apertures 730. The apertures 730 provide space through which a thermal interface material (TIM) 704 may pass as the spring form 702 is compressed between the lid 150 and the heat sink 600. The TIM 704 is generally similar to the TIM 140 described above.

As the TIM 704 squeezes between the lid 150 and the heat sink 600, the TIM 704 not only coats the facing surfaces of the lid 150 and the heat sink 600, but also encapsulates the spring form 702. The encapsulated spring form 702 has good the heat transfer with the TIM 704. Thus, the heat transfer between the lid 150 and the heat sink 600 is enhanced by providing a combination of conductive paths between the lid 150 and the heat sink 600 that includes a path directly through the spring form 702, a path directly through the TIM 704, and a path routed though both the spring form 702 and the TIM 704. Accordingly, the chip package 700 has improved heat transfer characteristics as compared to conventional chip packages, and thus, allows greater performance and reliability.

Figure 8:
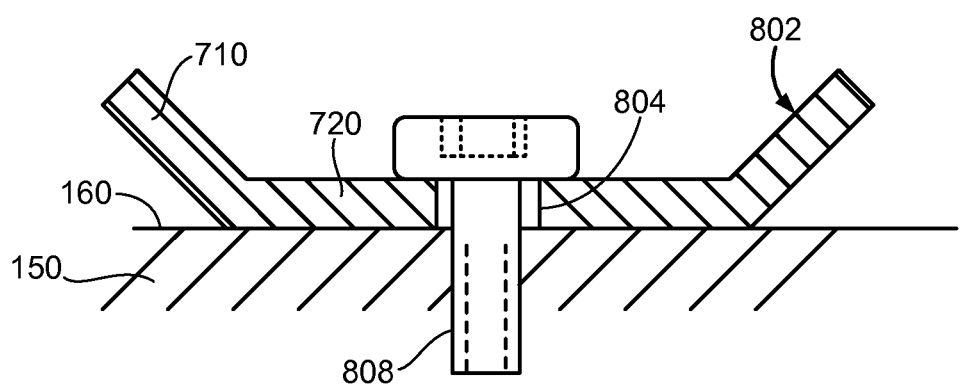
FIG. 8 is partial sectional view of a lid having another external spring form coupled thereto.

FIG. 8 is partial sectional view of a lid 150 having another external spring form 802 coupled thereto. The spring form 802 may be similar to the spring form 702 described above, or have another configuration.

The spring form 802 includes a mounting aperture 804 formed therethrough. A diameter of the mounting aperture 804 is generally selected to provide a clearance hole for a fastener 810. The fastener 810 extends through the mounting aperture 804 and engages mounting hole 808 formed in the lid 150. The fastener 810 may be a machine screw, rivet, spring pin or other suitable fastener. In embodiments wherein the fastener 810 may be a threaded fastener, the mounting hole 808 formed in the lid 150 be threaded. The fastener 810 prevents the spring form 802 from becoming separated from the lid 150 prior to installation of the heat sink 600.

Figure 9A:
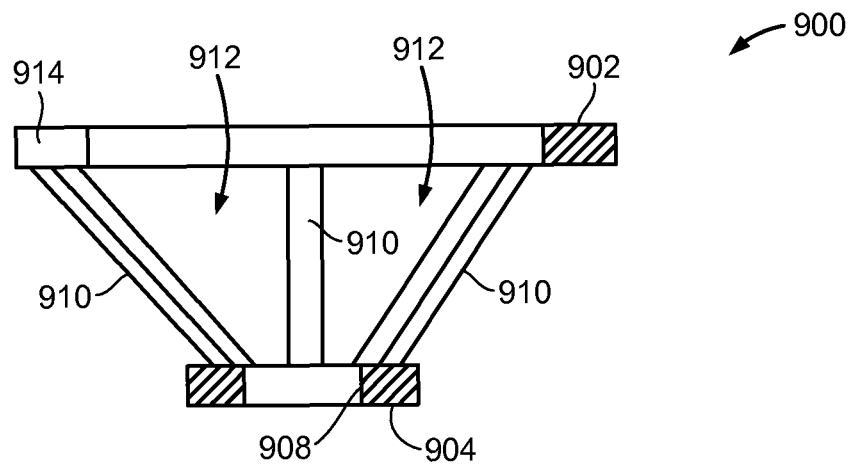
FIG. 9A is a sectional view of one embodiment of a spring form for enhancing heat transfer with a lid of an integrated chip package.
Figure 9B:
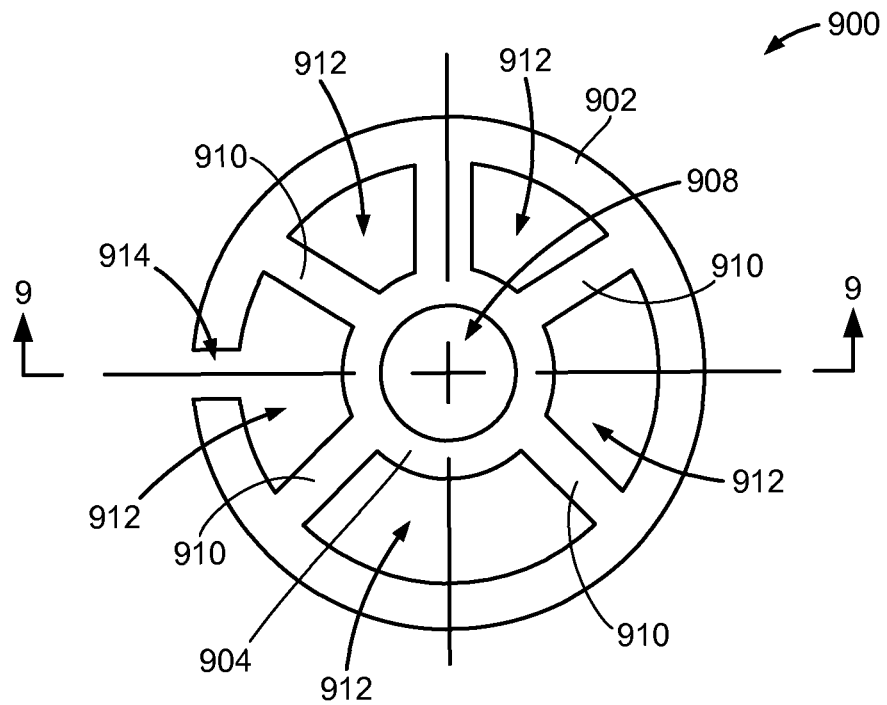
FIG. 9B is a top view of the spring form of FIG. 9A.

FIGS. 9A-9B are sectional and top views of one embodiment of a spring form 900 for enhancing heat transfer with a lid 150 of an integrated chip package. As further discussed below with reference to FIGS. 10A-10B, the spring form 900 may be utilized for enhancing the heat transfer between the lid 150 and at least one or both of an IC die 114 or heat sink 600.

The spring form 900 includes a first contact surface 902 and a second contact surface 904. The contact surfaces 902, 904 are connected by one or more flexures 910. The spring form 702 is configured such that the first contact surfaces 902 remains in contact with the top surface 160 of the lid 150, while the second contact surfaces 904 remains in contact with the bottom surface of the heat sink 600 when the heat sink 600 is mounted to the chip package, thereby compressing the spring form 702. Although the first contact surface 902 is shown outward of the second contact surfaced 904, the relative arrangement between the contact surfaces 902, 904 may be chosen as desired.

The spring form 702 includes a plurality of apertures 912 defined between the flexures 910. The apertures 912 provide space through which a thermal interface material (such as the TIM 704 described above) may pass as the spring form 702 is compressed between the lid 150 and the heat sink 600 and/or IC die 114. When the spring form 702 is compressed, the apertures 912 allow the TIM to encapsulate the flexures 910 while coating the contact surfaces 902, 904, thereby enhancing the heat transfer with the lid as described above.

The spring form 702 may also include a mounting apertures 914 defined through the second contact surface 904. The mounting apertures 914 is utilized to secure the spring form 702 to the lid 150, as discussed with reference to FIG. 8.

Figure 10A:
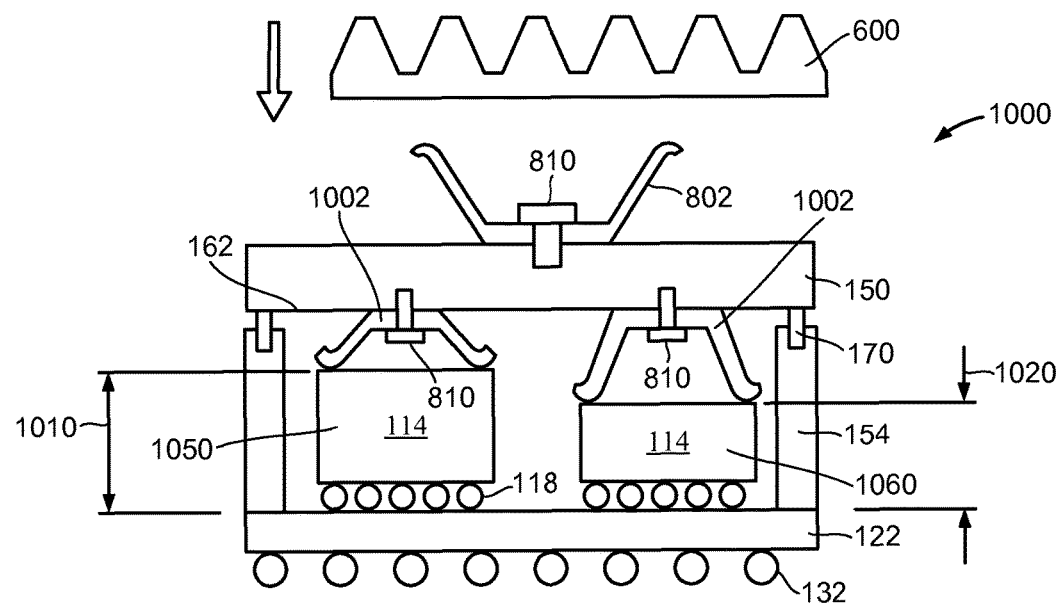
FIG. 10A is a cross sectional schematic view of an integrated chip package including one or more IC dies covered by a lid, the lid having one or more optional internal spring forms for enhancing heat transfer between the lid and one or more IC dies.
Figure 10B:
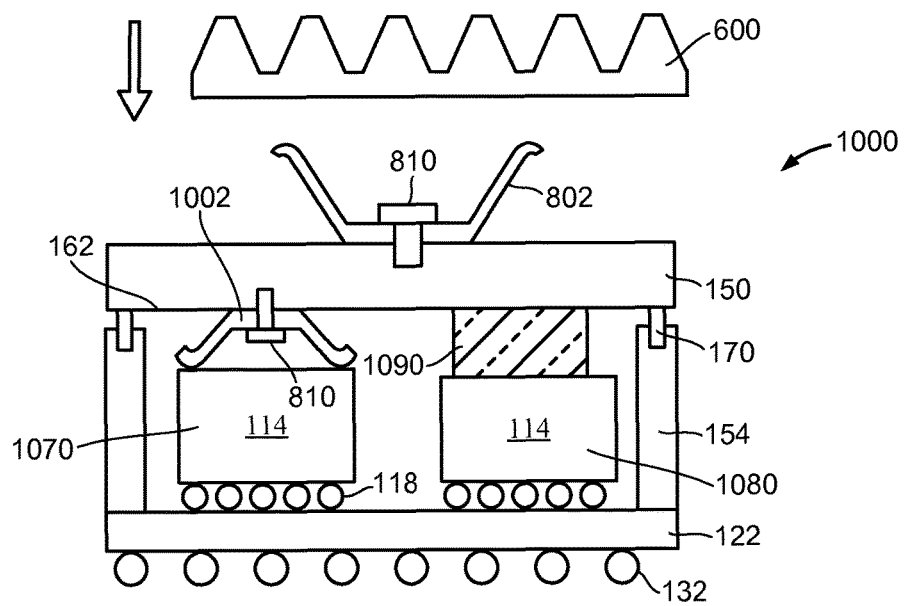
FIG. 10B is a cross sectional schematic view of another integrated chip package including one or more IC dies covered by a lid, the lid having one or more optional internal spring forms for enhancing heat transfer between the lid and one or more IC dies.

FIGS. 10A-10B are sectional views of different embodiments of an integrated chip package 1000 including one or more IC dies 114 covered by a lid 150, the lid 150 having one or more optional internal spring forms 1002 for enhancing heat transfer between the lid 150 and the one or more IC dies 114, and an external spring form 802 for enhancing heat transfer between the lid 150 and a heat sink 600. A thermal interface material (TIM) is not shown in FIGS. 10A-10B, but may be utilized with the spring forms 802, 1002 to enhance heat transfer as described above. The spring form 802 is generally described above with reference to FIG. 8, although other spring forms for enhancing heat transfer between the lid 150 and a heat sink 600 may be utilized.

The internal spring form 1002 may be fabricated similar to that of the spring forms 702, 802, 900, although other spring forms for enhancing heat transfer between the lid 150 and the one or more IC dies 114 may be utilized. The internal spring form 1002 may be coupled to the bottom surface 162 of the lid 150, for example, by use of a fastener 810.

The force applied by the internal spring form 1002 to the IC die 114 may be selected based upon the construction and heat transfer requirements of the IC dies 114. In FIG. 10A, the IC dies 114 are shown as a memory die 1050 and a logic die 1060. For example, an internal spring form 1002 contacting the memory die 1050 may be configured to produce less force when compressed than a force generated by an internal spring form 1002 contacting the logic die 1060.

Thus, within a single chip package, the force generated by the internal spring forms 1002 in contact with different IC dies 114 may be different. For example, different internal spring forms 1002 in the same chip package may have different spring constants and/or different compressed lengths. It is also contemplated that the bottom surface 162 of the lid 150 may include pads (not shown) disposed over selected IC dies that project different distances from the bottom surface 162 of the lid 150 so that the same internal spring forms 1002 will have different compressed lengths, and thereby generate different forces while using the same spring form. Tailoring of the compression forces generated by different internal spring forms 1002 allows greater design flexibility.

In another implementation, the internal spring forms 1002 in the same chip package may have different compressed lengths after installation due to tolerance differences and/or height differences between the IC dies 114. The ability of provide contact between the IC dies 114 and the lid 150 having different stack heights ensures good heat transfer with lower manufacturing costs without sacrificing heat transfer performance.

In the embodiment depicted in FIG. 10A, one of the IC dies 114 has a height 1010 that is greater than a height 1020 of a second one of the IC dies 114. The difference in heights may be accommodated by using different spring forms 1002, or by using spring forms 1002 that allow for a wide range of compression without generating a force that exceeds the maximum force that can be applied to either of the IC dies 114.

In the embodiment depicted in FIG. 10B, one of the IC dies 114 has a thermal budget that is greater than a thermal budget of a second one of the IC dies 114. To preferentially cool the IC die 114 having the higher thermal budget (shown as IC die 1070), the spring form 1002 is utilized in contact with the high thermal budget IC die 1070, while an IC die 114 having a lower thermal budget (shown as IC die 1080) may have a low heat transfer rate material 1090, such as a dielectric foam, disposed between the lower thermal budget die 1080 and the lid 150. The ability for diffident IC dies 114 to have significantly different rates of heat transfer with the lid 150 provides greater design flexibility without sacrificing device performance.

Figure 10C:
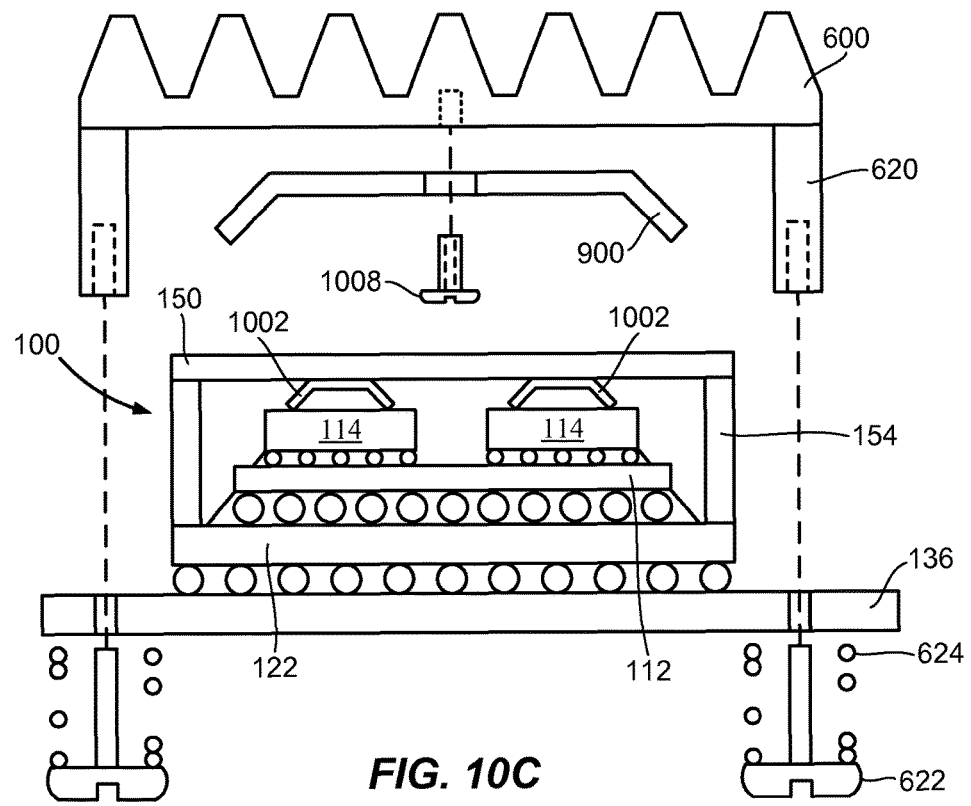
FIG. 10C is an exploded side view of an integrated chip package, a heat sink and a printed circuit board prior to assembly.

FIG. 10C is an exploded side view of an integrated chip package 100, a heat sink 600 and a printed circuit board 134 prior to assembly. A spring form 900 is provided between the lid 150 and the heat sink 600 to control the force the heat sink 600 exerts on the lid 150 after assembly. The spring form 900 may be any suitable spring from, such as described above. Additionally, a TIM (not shown) may be disposed between the lid 150 and the heat sink 600 to improve heat transfer therebetween. The spring form 900 may be configured to allow the TIM to capsulation and/or coat some or all of the spring form 900 as described above. Although the embodiment of FIG. 100 depicts a spring 1002 disposed between the die 114 and the lid 150, a low heat transfer rate material 1090 and/or TIM may alternatively be utilized between the die 114 and the lid 150.

Figure 10D:
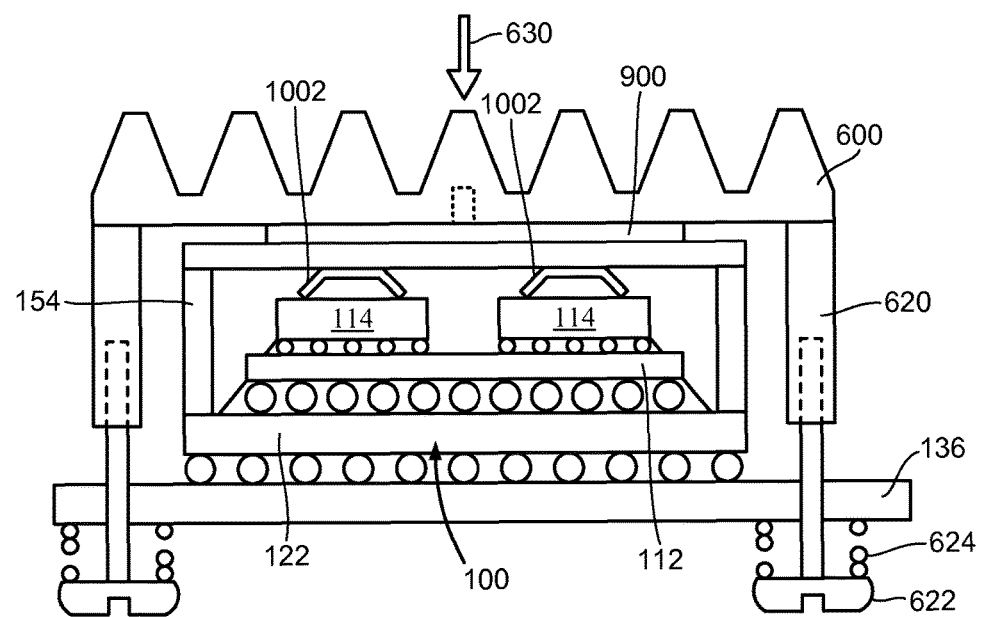
FIG. 10D is a side view of the integrated chip package, the heat sink and the printed circuit board of FIG. 10C after assembly.

Upon assembly, a fastener 1008 secures the spring form 900 to the heat sink 600, while fasteners 622 secure the heat sink 600 to the printed circuit board 136. The loading of the spring form 900 and spring 624 urge the heat sink 600 against the lid 150, as shown by the force arrow 630 illustrated in FIG. 10D.

In embodiments where multiple chip packages 100 are secured to a single printed circuit board 136 by a single heat sink 600, the individual spring forms 900 disposed between the heat sink 600 and each lid 150 allows the load on the dies 114 which each chip package 100 to be set at a different force. Additionally, the spring forms 900 allow for chip packages 100 having different heights to be secured by a common heat sink 600.

Figure 11:
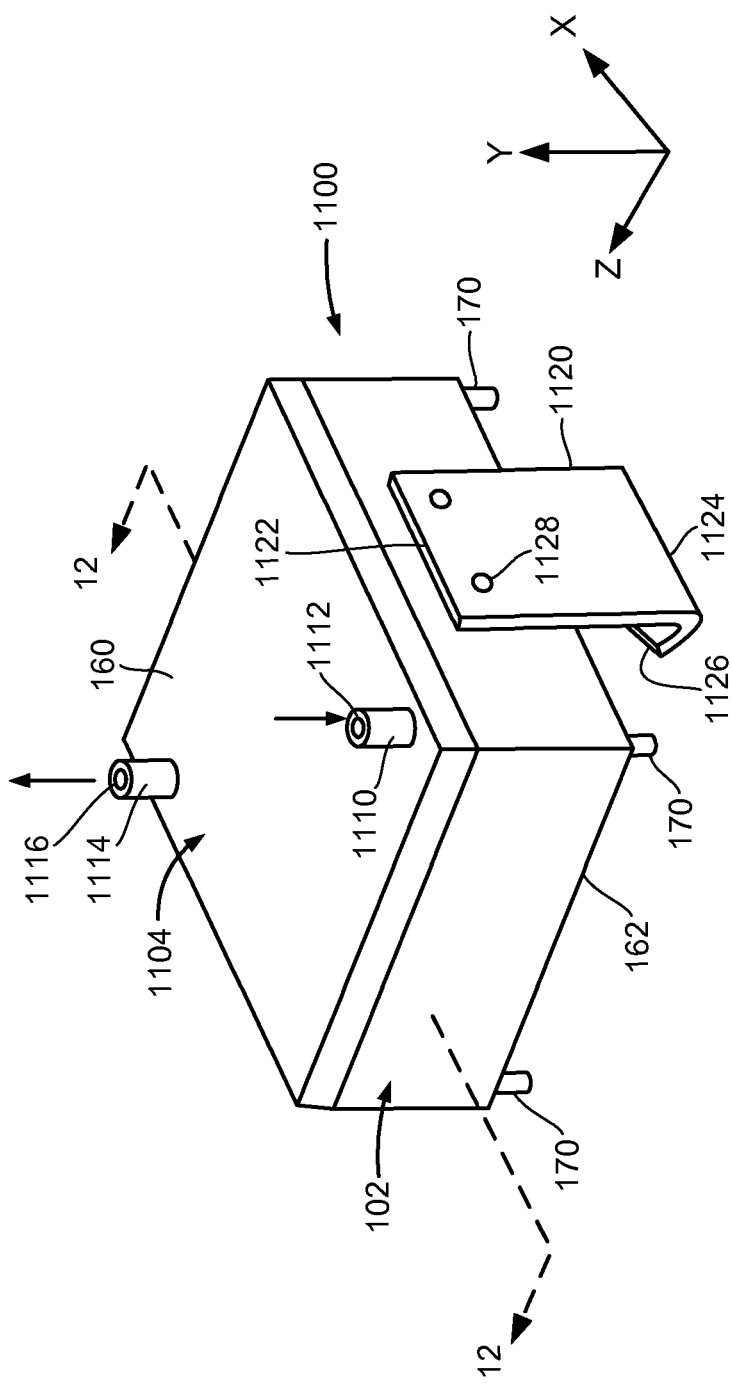
FIG. 11 is a schematic perspective view of one embodiment of a lid for enhancing heat transfer with an integrated chip package.
Figure 12:
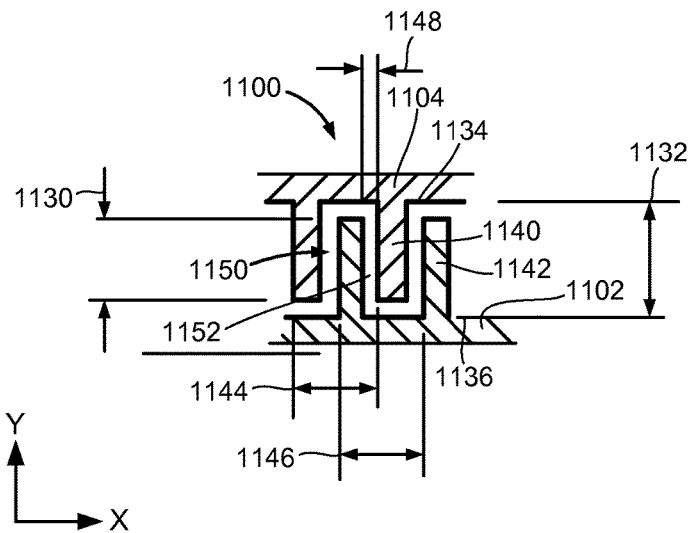
FIG. 12 is a partial sectional view of the lid taken along section lines 12-12 of FIG. 11.

FIG. 11 is a schematic perspective view of one embodiment of a lid 1100 for enhancing heat transfer with an integrated chip package, such as the chip package 100, among others. FIG. 12 is a partial sectional view of the lid 1100 taken along section lines 12-12 of FIG. 11. The lid 1100 may be utilized with or without a heat sink.

Referring to both FIGS. 11-12, the lid 1100 includes a bottom housing 1102 and a top housing 1104 that together sealingly confirm a cavity 1150. A heat transfer material, as further described below, may be flowed through the cavity 1150 to provide an active heat transfer mechanism for conducting heat out of the lid 1100.

The housings 1102, 1104 are generally formed form a thermally conductive material, such as a metal. The housings 1102, 1104 may be coupled using an adhesive, brazing, welding or other suitable technique. The housings 1102, 1104 have interior facing surfaces 1136, 1134 that are spaced apart by a distance 1132. The interior facing surfaces 1136, 1134 define the upper and lower boundary of the cavity 1150. interior facing surfaces 1136, 1134.

The lid 1100 may be mounted to the chip package by any suitable technique. In one implementation, a clip 1120 may be utilized to hold the lid 1100 to the substrate or other portion of the chip package. The clip 1120 has a top edge 1122 that extends beyond the bottom surface 162 of the lid 1100 to a bottom edge 1124. The bottom edge 1124 includes an inwardly turned hook 1126 for interfacing and securing the clip 1120 to the chip package. The clip 1120 may be coupled to the lid 1100 using any suitable technique, such as bonding, fasteners, welding, mechanical interlock and the like. In the embodiment depicted in FIG. 11, the clip 1120 is coupled to the lid 1100 by spot welds 1128. The clip 1120 allows the lid 1100 to be coupled the chip package at any convenient time or location, and also allows the lid 1100 to be coupled to chip packages already in use when environmental or processing conditions require increased heat removal capacity. The clip 1120 also allows the lid 1100 to be fit over chip packages having existing lids without need to remove the existing lid. The clip 1120 may also be utilized to secure the other lids described herein to the package substrate 122 or a surface mount hook or other mounting feature of printed circuit board 136 illustrated in FIG. 1 or other printed circuit board.

The lid 1100 includes an inlet port 1112 and an outlet port 1116 for circulating a heat transfer material, such a liquid, gas or multi-phase material, through the cavity 1150. In the embodiment depicted in FIG. 11, the ports 1112, 1116 are shown formed through the top housing 1104. However, the ports 1112, 1116 may be formed through other portions of the lid 1100.

The inlet port 1112 may be formed in a boss 1110 extending from the top housing 1104, while the outlet port 1116 may be formed in a boss 1114 extending from the top housing 1104. The bosses 1110, 1114 may include features, such as threads, to facilitate coupling the cavity 1150 to a heat transfer material source. The bottom of the housing 1102 may optionally include pins 170 extending therefrom to assist locating the lid 1100 to a component of the chip package, such as the stiffener 154 as shown in FIG. 1.

A plurality of heat transfer fins 1140 extend from the bottom interior surface 1134 of the top housing 1104 into the cavity 1150. The heat transfer fins 1140 have a pitch 1144.

Similarly, a plurality of heat transfer fins 1142 extend from the top interior surface 1136 of the bottom housing 1102 into the cavity 1150. The heat transfer fins 1142 have a pitch 1146, which may be substantially equal to the pitch 1144. The heat transfer fins 1140, 1142 interleave such that the fins 1140, 1142 are overlapped by a distance 1130, for example by at least 5 µm. The width of the fins 1140, 1142, along with the pitches 1144, 1146, define a width 1148 of a channel 1152 formed the fins 1140, 1142. In one example, the width 1148 may be at least about 1 µm. The interleaving of the fins 1140, 1142 allows the channel 1152 to have a very high aspect ratio (overlap distance 1130 to the width 1148) than that of a channel formed in a single element of material. In one example, the high aspect ratio may be greater than about 1. The high aspect ratio provides a high surface area, which in turn, enables a higher rate of heat transfer compared to conventional lids. The higher rate of heat transfer provided by the lid 1100 allows for better temperature control of the IC dies 114, which in turn provides better performance and reliability of the chip package.

Figure 13:
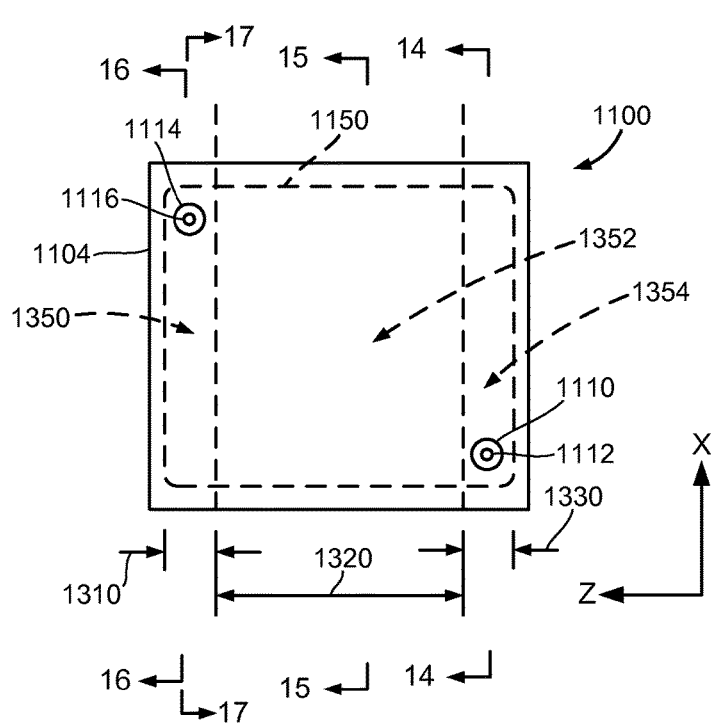
FIG. 13 is a top view of the lid of FIG. 11.

Referring now to a top view of the lid 1100 of FIG. 13, the cavity 1150, is shown in phantom, is separated into three zones 1350, 1352 and 1354. The inlet zone 1354 is separated from the outlet zone 1350 by the center zone 1352. The center zone 1352 generally has a length 1320, which may also equal the lengths of the fins 1140, 1142. The inlet zone 1354 extends a distance 1330 from the end of the center zone 1352 to the edge of the cavity 1150. The outlet zone 1350 extends a distance 1310 from the opposite end of the center zone 1352 to the opposite edge of the cavity 1150.

Figure 14:
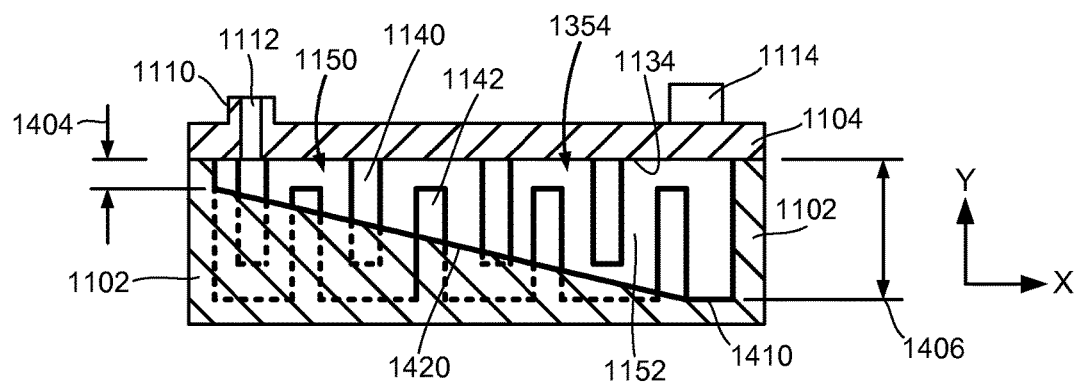
FIG. 14 is a sectional view of the lid taken along section lines 14-14 of FIG. 13.

FIGS. 14-17 are sectional views of the lid 1100 taken through section lines shown in FIG. 13 to provide details of the configuration of the cavity 1150 within each of the zones 1350, 1352 and 1354. Referring first to FIG. 14, FIG. 14 is a sectional view of the lid 1100 taken along section lines 14-14 of FIG. 13 illustrating the configuration of the cavity 1150 within the inlet zone 1354. The inlet port 1112 is directly connected to the cavity 1150 within the inlet zone 1354. The cavity 1150 within the inlet zone 1354 is bounded by the bottom interior surface 1134 of the top housing 1104 and an angled bottom surface 1420 of the bottom housing 1102. The angled bottom surface 1420 is about a distance 1404 from the bottom interior surface 1134 of the top housing 1104 at an end of the inlet zone 1354 closest to the inlet port 1112, and about a distance 1406 from the bottom interior surface 1134 of the top housing 1104 at an end of the inlet zone 1354 farthest to the inlet port 1112. Thus, the angled bottom surface 1420 causes the volume of zone 1354 to expand in a direction moving away from the inlet port 1112. The expanding volume of the inlet zone 1354 causes heat transfer material entering the inlet port 1112 to be distributed in a more uniform manner into the channels 1152 defined between the fins 1140, 1142. That is, the amount of heat transfer material flow entering the channels 1152 of the center zone 1352 closer to the inlet port 1112 is substantially equal to that entering the channels 1152 farthest from the inlet port 1112.

Figure 15:
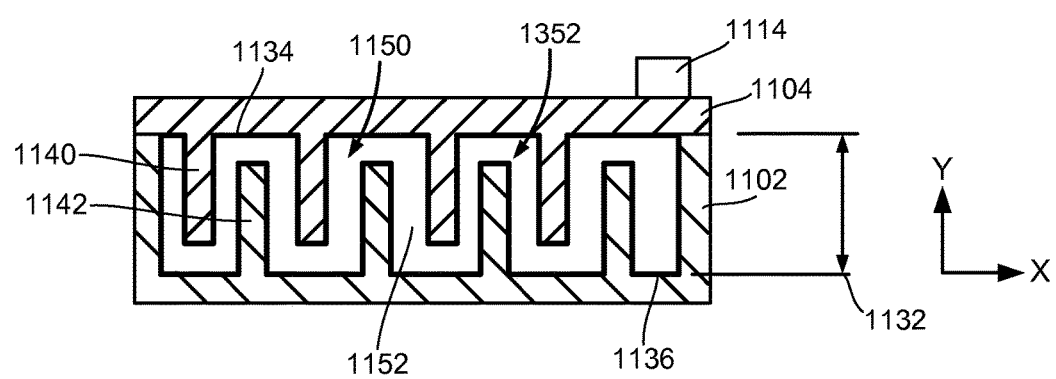
FIG. 15 is a sectional view of the lid taken along section lines 15-15 of FIG. 13.

FIG. 15 is a sectional view of the lid 1100 taken along section lines 15-15 of FIG. 13 illustrating the configuration of the cavity 1150 within the center zone 1352. The heat transfer material flowing through the channels 1152 is in full contact with the fins 1140, 1142, thereby promoting each transfer between the bottom housing 1102 and the top housing 1104 to regulate the temperature of the IC dies 114.

Figure 16:
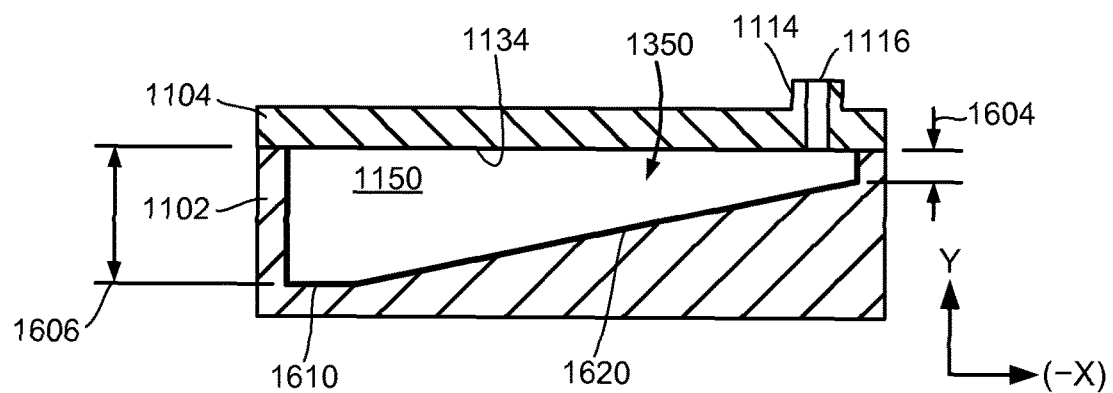
FIG. 16 is a sectional view of the lid taken along section lines 16-16 of FIG. 13.
Figure 17:
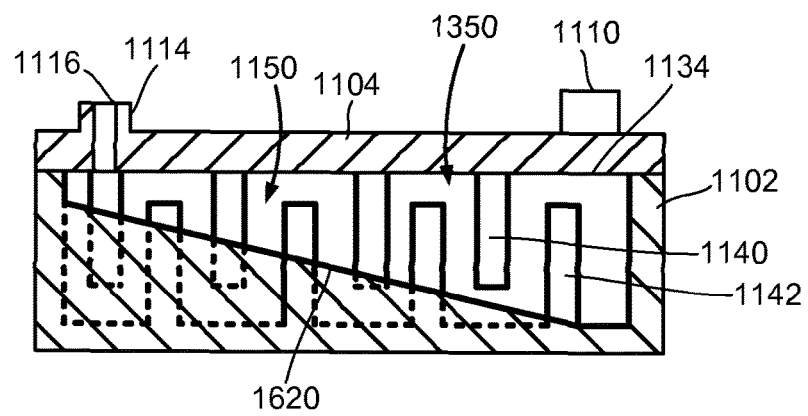
FIG. 17 is a sectional view of the lid taken along section lines 17-17 of FIG. 13.

FIG. 16 is a sectional view of the lid 1100 taken along section lines 16-16 of FIG. 13 in a direction away from the center zone 1352, illustrating the configuration of the cavity 1150 within the outlet zone 1350. FIG. 17 is a sectional view of the lid 1100 taken along section lines 17-17 of FIG. 13 in a direction towards the center zone 1352, illustrating the configuration of the cavity 1150 within the outlet zone 1350. Referring now to both FIGS. 16-17, the outlet port 1116 is directly connected to the cavity 1150 within the outlet zone 1350. The cavity 1150 within the outlet zone 1350 is bounded by the bottom interior surface 1134 of the top housing 1104 and an angled bottom surface 1620 of the bottom housing 1102. The is angled bottom surface 1620 is about a distance 1604 from the bottom interior surface 1134 of the top housing 1104 at an end of the outlet zone 1350 closest to the outlet port 1116, and about a distance 1606 from the bottom interior surface 1134 of the top housing 1104 at an end of the outlet zone 1350 farthest to the outlet port 1116. Thus, the angled bottom surface 1420 causes the volume of the outlet zone 1350 to reduce in size in a direction moving towards the outlet port 1116. The decreasing volume of the outlet zone 1350 causes heat transfer material to enter the outlet zone 1350 in a more uniform manner from the channels 1152 defined between the fins 1140, 1142 due to the increased pressure proximate the outlet port 1116. Thus, the expanding volume of inlet zone 1554 and the decreasing volume of the outlet zone 1350 causes a more uniform distribution of heat transfer material flow across the channels 1152 of the center zone 1352. The flow uniformity promotes more even profile of the rate heat transfer across the lid 1100, which in turn, provides better performance and reliability of the chip package.

The chip package described above advantageously provides better heat transfer between the lid and the dies. The better heat transfer between the lid and the dies reduces the potential of the lid delaminating from the chip package, better device performance, and increase reliability.

While the foregoing is directed to embodiments of the present disclosure, other and further embodiments may be devised without departing from the basic scope thereof, and the scope thereof is determined by the claims that follow.

What is claimed is:

1. A chip package, comprising:
    a package substrate;
    a first IC die coupled to the package substrate;
    a stiffener coupled to the package substrate and circumscribing the first IC die;
    a lid having a first surface and a second surface, the second surface facing away from the first surface and towards the first IC die, the second surface of the lid conductively coupled to the first IC die, the lid mechanically decoupled from the stiffener; and
    a pin positioning the lid horizontally relative to the stiffener while allowing the lid to float vertically unrestricted relative to the stiffener in a direction normally away from the package substrate, the pin configured to have free and unrestricted engagement and disengagement at least one of the lid and the stiffener.

2. The chip package of claim 1, wherein the pin extends from the second surface of the lid, the pin engaged in a clearance hole formed through a top surface of the stiffener and having a depth at least as long as the pin, the lid and the pin movable relative to the stiffener.

3. The chip package of claim 1, wherein the lid further comprises:
    a cavity formed therein.

4. The chip package of claim 3, wherein the cavity is plugged and charged with a captured heat transfer material.

5. The chip package of claim 3, wherein the lid further comprises:

an inlet port and an outlet port for circulating a heat transfer material through the cavity.

6. The chip package of claim 1, wherein the lid further comprises:
a plurality of engineered features projecting from at least one of the first or second surfaces of the lid.

7. The chip package of claim 1 further comprising:
a clip securing the lid to the package substrate.

8. The chip package of claim 1 further comprising:
a spring form disposed on the first surface of the lid.

9. The chip package of claim 1 further comprising:
a first spring form compressed between the second surface of the lid and the first IC die.

10. The chip package of claim 9 further comprising:
a second IC die mounted to the package substrate: and
a second spring form compressed between the second surface of the lid and the second IC die.

11. The chip package of claim 9 further comprising:
a second IC die mounted to the package substrate, the second IC die in thermal communication with the second surface of the lid through a low heat transfer rate material disposed therebetween, wherein a heat transfer rate between the second IC die and the second surface of the lid is lower than a heat transfer rate between the first IC die and the second surface of the lid.

12. The chip package of claim 9 further comprising:
a thermal interface material disposed through apertures formed in the first spring form.

13. The chip package of claim 1 further comprising:
a second IC die mounted to the package substrate and outward of the lid.

14. The chip package of claim 13 further comprising:
a heatsink, wherein the first IC die is conductively coupled to the heatsink through the lid while the second IC die is not.

15. The chip package of claim 1, wherein the lid further comprises:
a plurality of engineered features projecting from at least one of the first or second surfaces of the lid; and
a phase change thermal interface material disposed on the engineered features.

16. A chip package, comprising:
a package substrate;
a first IC die coupled to the package substrate;
a stiffener coupled to the package substrate and circumscribing the first IC die;
a lid having a first surface and a second surface, the second surface facing away from the first surface and towards the first IC die, the second surface of the lid conductively coupled to the first IC die, the lid mechanically decoupled from the stiffener;
a pin extending between the lid and the stiffener, the pin free to move axially in a clearance hole formed through an exposed surface of the stiffener or the second surface of the lid, the clearance hole having a depth at least as long as the pin:
a first spring form compressed between the second surface of the lid and the first IC die;
a second IC die mounted to the package substrate: and
a second spring form compressed between the second surface of the lid and the second IC die, wherein a force provided by the first spring form to the first IC die is different than a force provided by the second spring form to the second IC die.

17. A lid for a chip package, comprising:
a bottom housing having a bottom exterior surface;
a top housing sealingly coupled to the bottom housing; and
a cavity defined between the top and bottom housings; the cavity further comprising:
an inlet zone having a volume expanding in a first lateral direction away from an inlet port, the first lateral direction parallel with the bottom exterior surface of the bottom housing;
an outlet zone having a volume decreasing in a second lateral direction that is opposite the first lateral direction and towards an outlet port, the second lateral direction parallel with the bottom exterior surface of the bottom housing;
a center zone extending in a third direction and connecting the inlet and outlet zones, wherein the first and second lateral directions are perpendicular to and coplanar with the third direction, the third direction parallel with the bottom exterior surface of the bottom housing; and
a plurality of heat transfer fins extending into the center zone of the cavity.

18. The lid of claim 17, wherein the plurality of heat transfer fins further comprises:
a first plurality of heat transfer fins extending from an interior bottom surface of the top housing; and
a second plurality of heat transfer fins extending from an interior top surface of the bottom housing, the second plurality of heat transfer fins interleaving with the first plurality of heat transfer fins.

19. The lid of claim 17 further comprising:
a plurality of pins extending from the bottom exterior surface of the bottom housing.

* * * * *